(12) United States Patent
Zhao et al.

(10) Patent No.: US 10,487,389 B2
(45) Date of Patent: Nov. 26, 2019

(54) EVAPORATION DEVICE AND EVAPORATION METHOD USING THE SAME

(71) Applicant: BOE TECHNOLOGY GROUP CO., LTD., Beijing (CN)

(72) Inventors: Dejiang Zhao, Beijing (CN); Hao Wang, Beijing (CN); Seiji Fujino, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 338 days.

(21) Appl. No.: 15/321,137

(22) PCT Filed: Mar. 15, 2016

(86) PCT No.: PCT/CN2016/076369
§ 371 (c)(1),
(2) Date: Dec. 21, 2016

(87) PCT Pub. No.: WO2016/169357
PCT Pub. Date: Oct. 27, 2016

(65) Prior Publication Data
US 2017/0211173 A1 Jul. 27, 2017

(30) Foreign Application Priority Data
Apr. 24, 2015 (CN) .......................... 2015 1 0201679

(51) Int. Cl.
*C23C 14/24* (2006.01)
*C23C 14/12* (2006.01)

(52) U.S. Cl.
CPC ............ *C23C 14/246* (2013.01); *C23C 14/12* (2013.01); *C23C 14/24* (2013.01); *C23C 14/243* (2013.01)

(58) Field of Classification Search
None
See application file for complete search history.

(56) References Cited

U.S. PATENT DOCUMENTS 2,482,329 A * 9/1949 Dimmick ................ C23C 14/24
   118/727
3,667,424 A * 6/1972 Cornelius ............... C23C 14/24
   118/720

(Continued)

FOREIGN PATENT DOCUMENTS

CN       1854332 A    11/2006
CN     103526164 A     1/2014
(Continued)

OTHER PUBLICATIONS

Chinese First Office Action for Chinese Application No. 201510201679.5, dated Dec. 3, 2016, 9 Pages.

(Continued)

*Primary Examiner* — Thor S Campbell
(74) *Attorney, Agent, or Firm* — Brooks Kushman P.C.

(57) ABSTRACT

The present disclosure provides an evaporation device and an evaporation method using the evaporation device. The evaporation device includes a main chamber with an internal space and an evaporation mechanism under the main chamber. The evaporation mechanism includes at least two crucible accumulation chambers. The evaporation mechanism is configured to be operated in a first state where a first crucible accumulation chamber is at an evaporation position and in communication with the main chamber to form a vacuum space, and evaporation of a material in the crucible in the first crucible accumulation chamber is performed, and in a second state where, in a vacuum environment, the first crucible accumulation chamber is moved away from the evaporation position and a second crucible accumulation chamber is moved to the evaporation position and in communication with the main chamber.

20 Claims, 3 Drawing Sheets

(56) References Cited

U.S. PATENT DOCUMENTS

| | | | | |
|---|---|---|---|---|
| 4,023,523 A * | 5/1977 | Ing | ................ | C23C 14/24 |
| | | | | 118/726 |
| 4,217,856 A * | 8/1980 | Kraus | ................ | C23C 14/24 |
| | | | | 118/724 |
| 4,328,763 A * | 5/1982 | Sommerkamp | ........ | C23C 14/30 |
| | | | | 118/715 |
| 4,632,059 A * | 12/1986 | Flatscher | .............. | C23C 14/243 |
| | | | | 118/727 |
| 5,034,590 A * | 7/1991 | Yamamoto | .............. | C23C 14/30 |
| | | | | 219/121.15 |
| 6,342,103 B1 * | 1/2002 | Ramsay | ................ | C23C 14/243 |
| | | | | 118/723 EB |
| 7,378,133 B2 * | 5/2008 | Yamazaki | ................ | C23C 14/12 |
| | | | | 118/719 |
| 2012/0082778 A1 | 4/2012 | Shimada et al. | | |

FOREIGN PATENT DOCUMENTS

| | | | |
|---|---|---|---|
| CN | 103993268 A | 8/2014 | |
| CN | 104789930 A | 7/2015 | |
| JP | H0673152 U | 10/1994 | |
| JP | H11222668 A | 8/1999 | |
| JP | 2012229462 A | 11/2012 | |
| TW | 201122132 A | 7/2011 | |
| WO | 2011158453 A1 | 12/2011 | |

OTHER PUBLICATIONS

International Search Report and Written Opinion for Application No. PCT/CN2016/076369, dated Jun. 16, 2016, 13 Pages.

* cited by examiner

EVAPORATION DEVICE AND EVAPORATION METHOD USING THE SAME

CROSS-REFERENCE TO RELATED APPLICATIONS

This application is the U.S. national phase of PCT Application No. PCT/CN2016/076369 filed on Mar. 15, 2016, which claims priority to Chinese Patent Application No. 201510201679.5 filed on Apr. 24, 2015,the disclosures of which are incorporated in their entirety by reference herein.

TECHNICAL FIELD

The present disclosure relates to the manufacture of display devices, in particular to an evaporation device and an evaporation method using the evaporation device.

BACKGROUND

Organic light-emitting diode (OLED) display devices have become more and more popular due to such advantages as vivid colors, low power consumption and small thickness. Currently, during the manufacture of the OLED display device, an organic material is placed into a crucible in a high vacuum chamber, and then the crucible is heated so as to evaporate the organic material, thereby to form an organic thin film of the OLED display device. Hence, an evaporation process is indispensible during the manufacture of the OLED display device.

For an existing evaporation device, after the organic material is depleted during the evaporation, the vacuum chamber needs to be opened so as to add a new organic material, resulting in a waste of time as well as pollution. Hence, it is necessary to improve the evaporation device for the manufacture of the OLED display device, thereby to prevent pollution during the evaporation.

SUMMARY

An object of technical solutions of the present disclosure is to provide an evaporation device and an evaporation method using the evaporation device, so as to improve the manufacture efficiency and prevent an internal evaporation environment from being polluted as compared with the existing evaporation device where the vacuum chamber needs to be opened to add the new organic material.

The present disclosure provides in some embodiments an evaporation device, including a main chamber with an internal space and an evaporation mechanism under the main chamber. The evaporation mechanism includes at least two crucible accumulation chambers, and the at least two crucible accumulation chambers include a first crucible accumulation chamber and a second crucible accumulation chamber. The evaporation mechanism is configured to be operated in a first state where the first crucible accumulation chamber is located at an evaporation position for the evaporation of a material in the crucible received in the first crucible accumulation chamber and the first crucible accumulation chamber is in communication with the main chamber to form a vacuum space, and in a second state where, in a vacuum environment, the first crucible accumulation chamber is moved away from the evaporation position and the second crucible accumulation chamber is moved to the evaporation position and in communication with the main chamber.

Optionally, the evaporation mechanism further includes a peripheral chamber in which the crucible accumulation chambers are arranged, and in the case that the evaporation mechanism is in the second state, a vacuum space is defined in the peripheral chamber.

Optionally, the evaporation mechanism further includes a first bracket with an accommodation space in which the crucible accumulation chambers are arranged, and a shape of the combined crucible accumulation chambers corresponds to a shape of the accommodation space.

Optionally, the evaporation mechanism further includes a driving mechanism connected to the first bracket, and configured to move the first bracket upward and downward and rotate the first bracket, so as to move the first crucible accumulation chamber away from the evaporation position and move the second crucible accumulation chamber to the evaporation position in the second state.

Optionally, an outer wall of each crucible accumulation chamber is covered with a sealant.

Optionally, the evaporation mechanism further includes a heating member secured on a side wall of the main chamber, a closable through-hole structure is provided at the side wall of the main chamber facing the heating member, and each crucible accumulation chamber is provided with an opening at a surface facing the main chamber. In the case that each crucible accumulation chamber is located at the evaporation position, the surface of the crucible accumulation chamber is closely attached onto the side wall of the main chamber in such a manner that the opening faces toward the through-hole structure and the crucible accumulation chamber is in communication with the main chamber through the through-hole structure in an open state, and the heating member is extended into the crucible accumulation chamber through the opening.

Optionally, the peripheral chamber is attached onto the side wall of the main chamber, and a portion of the lateral wall of the main chamber forms a side wall of the peripheral chamber.

Optionally, each crucible accumulation chamber is provided at a lateral wall with a first closable opening structure, and in the case that the first closable opening structure is in an open state, the crucible is capable of moving into or out of the crucible accumulation chamber.

Optionally, the peripheral chamber is provided at the lateral wall with a second closable opening structure. The second closable opening structure is configured to be operated in a closed state where an enclosed space is formed inside the peripheral chamber, and in an open state where the crucible accumulation chambers are exposed.

Optionally, the evaporation device further includes: a first vacuumizer configured to form a vacuum environment in the main chamber and the crucible accumulation chamber in communication with the main chamber; and a second vacuumizer configured to form a vacuum environment in the peripheral chamber.

Optionally, the evaporation device includes a plurality of evaporation mechanisms arranged under the main chamber and distributed evenly around a vertical axis of the main chamber.

Optionally, the evaporation device further includes a second bracket provided with an accommodation space, arranged under the main chamber and connected to the main chamber, and the evaporation mechanisms are arranged in the accommodation space of the second bracket.

The present disclosure provides in some embodiments an evaporation method using the above-mentioned evaporation device, including: moving the first crucible accumulation chamber to the evaporation position and enabling the first crucible accumulation chamber to be in communication with the main chamber; heating a material in a crucible received in the first crucible accumulation chamber to perform an evaporation process; when the material in the crucible received in the first crucible accumulation chamber has been depleted, in a vacuum environment, moving the first crucible accumulation chamber away from the evaporation position, moving the second crucible accumulation chamber to the evaporation position and enabling the second crucible accumulation chamber to be in communication with the main chamber; and heating the material in a crucible in the second crucible accumulation chamber to perform the evaporation process.

Optionally, during heating the material in the crucible received in the second crucible accumulation chamber to perform the evaporation process, the evaporation method further includes moving the crucible out of the first crucible accumulation chamber, adding a new material into the crucible, and moving the crucible into the first crucible accumulation chamber.

Optionally, subsequent to heating the material in the crucible received in the second crucible accumulation chamber to perform the evaporation process, the evaporation method further includes moving the crucibles out of the first crucible accumulation chamber and the second crucible accumulation chamber respectively, adding new materials into the crucibles, and moving the crucibles into the first crucible accumulation chamber and the second crucible accumulation chamber respectively.

Optionally, the heating the material in the crucible received in the first crucible accumulation chamber to perform the evaporation process includes: vacuumizing the main chamber so as to enable the main chamber and the first crucible accumulation chamber to be at a predetermined vacuum level; and pre-heating the crucible in the first crucible accumulation chamber to a predetermined temperature, and then performing the evaporation process until the material in the crucible has been depleted.

At least one of the above technical solutions in embodiments of the present disclosure has the following advantages.

The evaporation device includes at least two crucible accumulation chambers, and after the material in the crucible received in the first crucible accumulation chamber has been depleted, the second crucible accumulation chamber may be directly moved to the evaporation position in the vacuum environment for the evaporation. In this way, it is unnecessary to open the vacuum chamber to add the material, and as a result, it is able to reduce the tact time and prevent pollution.

DETAILED DESCRIPTION

In order to make the objects, the technical solutions and the advantages of the present disclosure more apparent, the present disclosure will be described hereinafter in conjunction with the drawings and embodiments.

The present disclosure provides in some embodiments an evaporation device, which includes a main chamber provided with an internal space and an evaporation mechanism arranged under the main chamber. The evaporation mechanism includes at least two crucible accumulation chambers, such as a first crucible accumulation chamber and a second crucible accumulation chamber. The evaporation mechanism is configured to be operated in a first state or in a second state. In the first state, the first crucible accumulation chamber is located at an evaporation position and in communication with the main chamber to form a vacuum space, and the evaporation of a material in the crucible received in the first crucible accumulation chamber is performed. In a second state, in a vacuum environment, the first crucible accumulation chamber is moved away from the evaporation position and the second crucible accumulation chamber is moved to the evaporation position and in communication with the main chamber.

According to the embodiments of the present disclosure, the evaporation device includes at least two crucible accumulation chambers, and after the material in the crucible received in the first crucible accumulation chamber has been depleted, the second crucible accumulation chamber may be directly moved to the evaporation position in the vacuum environment for the evaporation. In this way, it is unnecessary to open the vacuum chamber to add the material, and as a result, it is able to reduce the tact time and prevent pollution.

Figure 1:
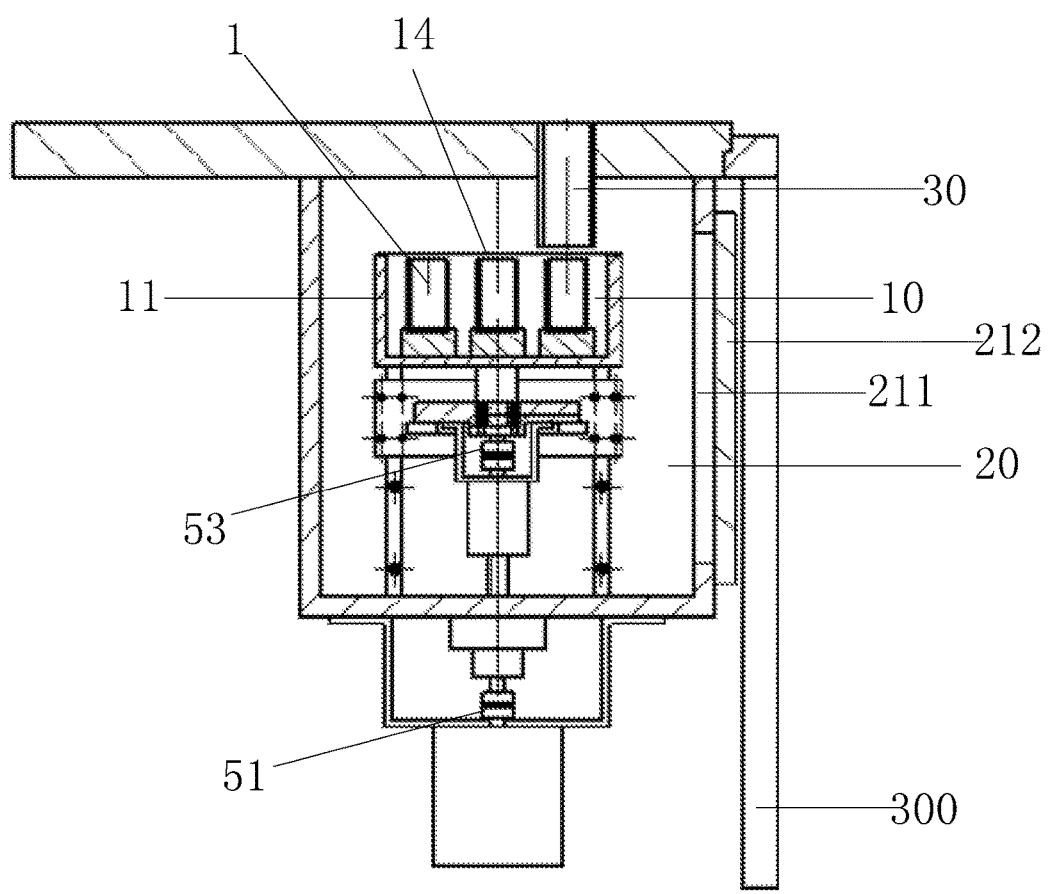
FIG. 1 is a partially sectional view of an evaporation device according to one embodiment of the present disclosure.

As shown in FIG. 1 which is a partially sectional view of the evaporation device according to one embodiment of the present disclosure, the evaporation device includes at least two crucible accumulation chambers 10 which are separated from each other and which, after being combined together, are arranged in a peripheral chamber 20. A crucible holder 1 is provided in each crucible accumulation chamber 10, so as to hold the crucible. The crucible holder 1 is just that commonly used in the art and the structure thereof is not a focus of the present disclosure, so it will not be particularly defined herein.

In addition, in the embodiments of the present disclosure, the so-called "crucible accumulation chamber", "peripheral chamber" and "main chamber" are each a structure including a chamber and a housing defining the chamber.

Through the combined structure of the crucible accumulation chambers 10 and the peripheral chamber 20, in the case that the material in the crucible received in the first crucible accumulation chamber 10 has been depleted, the peripheral chamber 20 may be vacuumized to form a vacuum environment therein. Then, the first crucible accumulation chamber may be moved away from the evaporation position, and the second crucible accumulation chamber may be moved to the evaporation position. At this point, the material in the crucible received in the second crucible accumulation chamber may be heated so as to perform the evaporation process. Hence, after the material in the crucible received in the first crucible accumulation chamber has been depleted, it is able to perform a next evaporation process without any necessary to open the vacuum chamber and add a new material, and as a result, it is able to reduce the tact time as well as the pollution.

Of course, apart from being combined and arranged in one peripheral chamber, the crucible accumulation chambers may also be each arranged in a separate vacuumizable chamber. At this time, it is also unnecessary to open the vacuum chamber and add the new material during the replacement of the crucible accumulation chamber.

Figure 2:
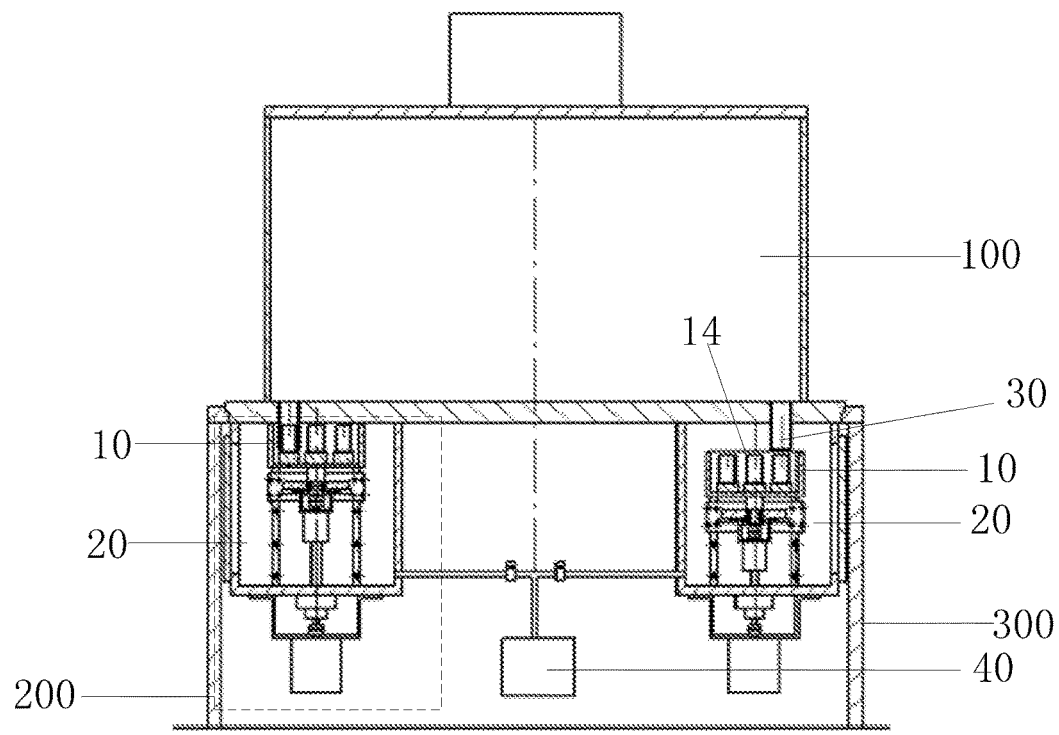
FIG. 2 is a sectional view of the evaporation device according to one embodiment of the present disclosure.
Figure 3:
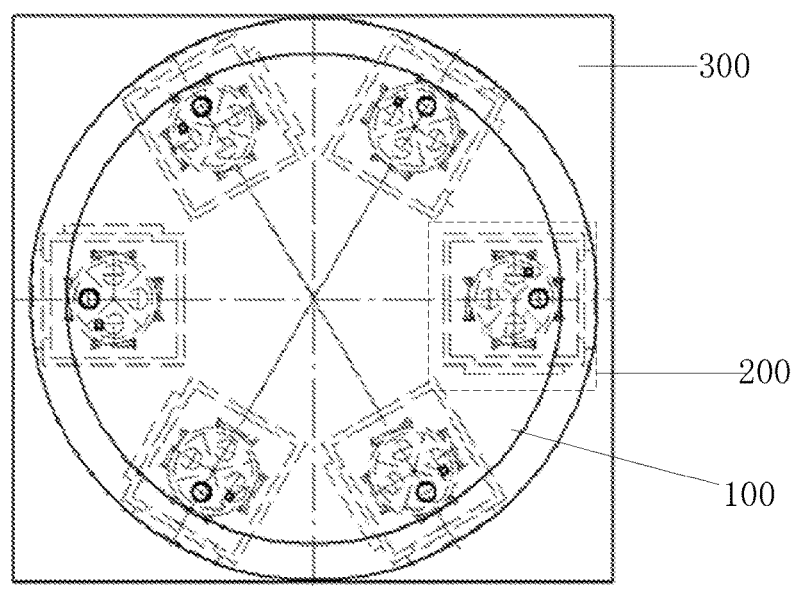
FIG. 3 is a top view of the evaporation device according to one embodiment of the present disclosure.

In addition, as shown in FIG. 2 which is a sectional view of the evaporation device and FIG. 3 which is a top view of the evaporation device, the evaporation device includes a main chamber 100 and a plurality of evaporation mechanisms 200 arranged under the main chamber 100 and distributed evenly around an axis of the main chamber 100 in a vertical direction. Referring to FIG. 3, in the embodiments of the present disclosure, six evaporation mechanisms 200 are distributed evenly around the axis of the main chamber 100 in the vertical direction. Through the plurality of the evaporation mechanisms 200, it is able to perform a plurality of evaporation process by an identical evaporation device at the same time.

Figure 4:
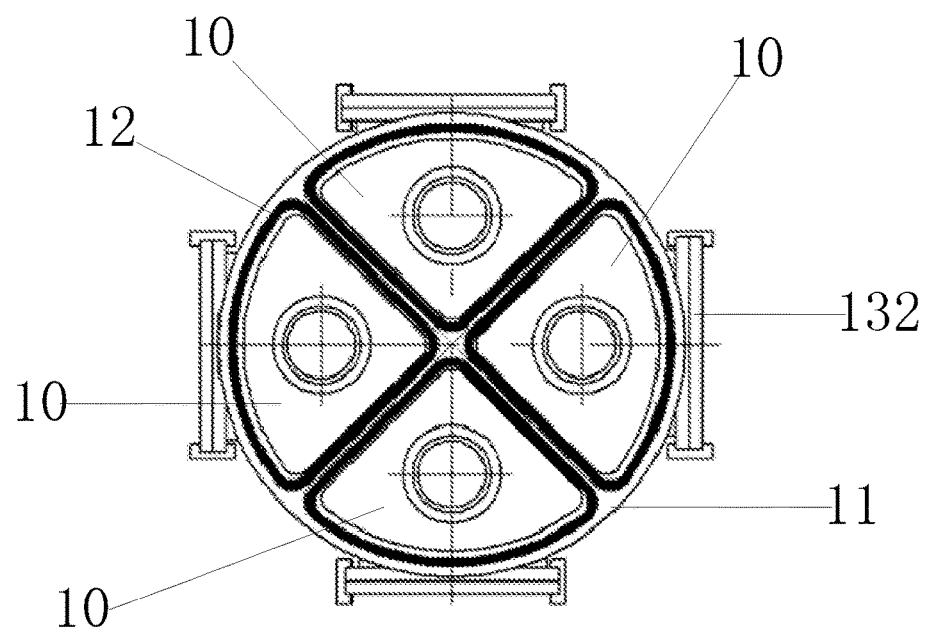
FIG. 4 is a top view of crucible accumulation chambers of the evaporation device according to one embodiment of the present disclosure.

As shown in FIGS. 1, 2 and 4, each evaporation mechanism 200 includes the peripheral chamber 20 and the plurality of crucible accumulation chambers 10 arranged inside the peripheral chamber 20. The peripheral chamber 20 is attached onto a side wall of the main chamber 100, and a portion of the side wall of the main chamber 100 forms one side wall of the peripheral chamber 20.

In addition, in some embodiments of the present disclosure, there are four crucible accumulation chambers 10 which are combined together and arranged in an accommodation space of a first bracket 11. A shape of the combined cavities corresponds to that of the accommodation space of the first bracket 11.

Referring to FIG. 4, in the embodiments of the present disclosure, the accommodation space of the first bracket 11 is of a cylindrical shape. The four crucible accumulation chambers 10 are distributed evenly in a horizontal plane, and a cross section of each crucible accumulation chamber in a horizontal direction is fan-shaped.

Further, as shown in FIGS. 1 and 2, the evaporation mechanism 200 further includes a driving mechanism connected to the first bracket 11, and configured to move the first bracket 11 upward and downward and rotate the first bracket 11, so as to move the first crucible accumulation chamber away from the evaporation position and move the second crucible accumulation chamber to the evaporation position in the second state of the evaporation mechanism 200.

To be specific, as shown in FIG. 1, the driving mechanism for driving the first bracket 11 may include a lifting mechanism 51 and a rotating mechanism 53. The lifting mechanism 51 is uprightly arranged on a bottom surface of the peripheral chamber 20. The rotating mechanism 53 is fixedly arranged above the lifting mechanism. The first bracket 11 is fixedly arranged on the rotating mechanism. The first bracket 11 is driven by the rotating mechanism to rotate around the axis, thereby enabling the various crucible accumulation chambers 10 in the first bracket 11 to rotate around the axis. The rotating mechanism and the first bracket 11 are driven by the lifting mechanism to move upward and downward, so as to adjust a height of each crucible accumulation chamber 10 relative to the bottom surface of the peripheral chamber 20 and adjust a distance between each crucible accumulation chamber 10 and the side wall of the main chamber 100.

In some embodiments of the present disclosure, the lifting mechanism 51 may be a cylinder, and the rotating mechanism and the first bracket 11 may be moved upward and downward through a piston of the cylinder. Also, the lifting mechanism 51 may also be a lead screw pair. The rotating mechanism 53 may be an electric motor fixedly arranged above the lifting mechanism 51, and an output shaft of the electric motor may be connected to the first bracket 11. Optionally, as shown in FIG. 4, an outer wall of each crucible accumulation chamber 10 is covered with a sealant 12, so as to ensure the hermeticity of the crucible accumulation chamber 10.

Figure 5:
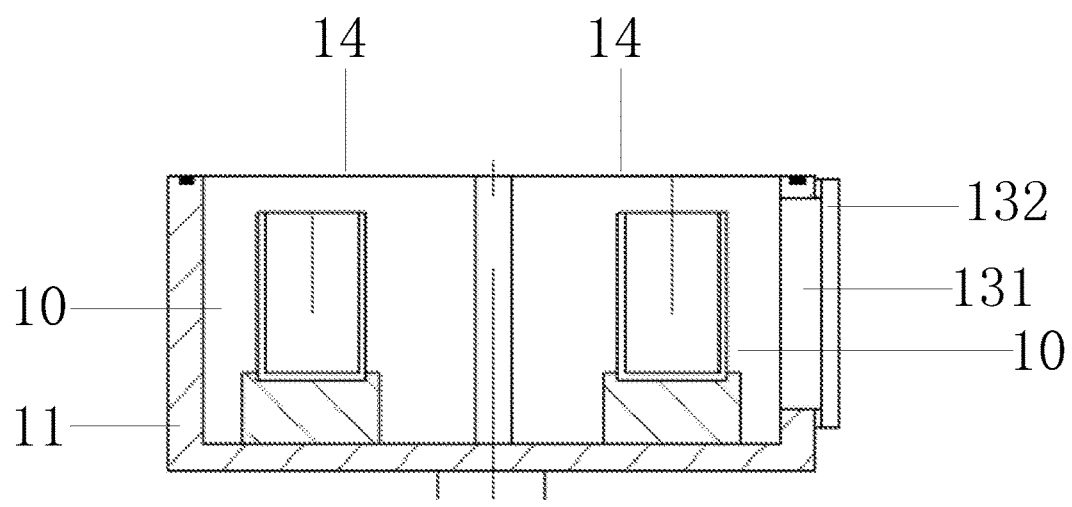
FIG. 5 is a sectional view of the crucible accumulation chambers of the evaporation device according to one embodiment of the present disclosure.

In addition, as shown in FIGS. 4 and 5, each crucible accumulation chamber 10 is provided at its lateral wall with a first closable opening structure. In the case that the first closable opening structure is in an open state, the crucible is capable of moving into or out of the crucible accumulation chamber 10. In the embodiments of the present disclosure, the first closable opening structure includes an opening 131 defined in the lateral wall of the crucible accumulation chamber 10 and a gate 132. The gate 132 is capable of rotating relative to the opening 131, so as to close the opening 131, or expose the opening 131 and enable the crucible accumulation chamber 10 to be in communication with the peripheral chamber 20.

The peripheral chamber 20 is further provided at the lateral wall with a second closable opening structure, which is configured to be operated in a closed state where an enclosed space is formed inside the peripheral chamber 20, and in an open state where the crucible accumulation chamber 10 is exposed. To be specific, as shown in FIG. 1, the second closable opening structure includes an opening 211 defined in the lateral wall of the peripheral chamber 20 and a gate 212. The gate 212 is capable of rotating relative to the opening 211, so as to close the opening 211, or expose the opening 211 and enable the peripheral chamber 20 to be in communication with an external environment. In this way, in the case that the opening 211 of the peripheral chamber 20 and the opening 131 of the crucible accumulation chamber 10 are opened, it is able to move the crucible out of the crucible accumulation chamber, so as to add the new material for the evaporation process.

Referring to FIGS. 1 and 2, the evaporation mechanism 200 of the evaporation device further includes a heating member 30 fixedly arranged on the side wall of the main chamber 100, a closable through-hole structure (not shown) is provided at the side wall of the main chamber 100 facing the heating member 30. Each crucible accumulation chamber 10 is provided with an opening 14 (as shown in FIG. 5) at a surface facing the main chamber 100. In the case that each crucible accumulation chamber 10 is located at the evaporation position, the surface of the crucible accumulation chamber 10 is closely attached onto the side wall of the main chamber 100 (e.g., a state of the evaporation mechanism 200 on the left in FIG. 2), so that the opening 14 faces toward the though-hole structure. The crucible accumulation chamber 10 is in communication with the main chamber 100 through the through-hole structure in an open state, and the heating member 30 is extended into the crucible accumulation chamber 10 through the opening 14.

Optionally, the heating member 30 may include two heating sources, one for pre-heating prior to the evaporation process, and one for heating the material during the evaporation process.

As shown in FIG. 2, the evaporation device further includes: a first vacuumizer (not shown) configured to form a vacuum environment in the main chamber 100 and the crucible accumulation chamber 10 in communication with the main chamber 100; and a second vacuumizer 40 configured to form a vacuum environment in the peripheral chamber 20.

In the embodiments of the present disclosure, the first vacuumizer is connected to the main chamber 100, and in the case that, as shown in FIG. 2, the evaporation mechanism on the left is being used for evaporation, the surface of the crucible accumulation chamber 10 where the opening 14 is provided is closely attached onto the side wall of the main chamber 100. The opening 14 of the crucible accumulation chamber 10 faces toward the through-hole structure in the main chamber 100. In the case that the heating member 30 is extended into the crucible accumulation chamber 10 through the opening 14, the main chamber 100 may be vacuumized by the first vacuumizer. The crucible accumulation chamber 10 of the evaporation mechanism is in communication with the main chamber 100 to form the enclosed space, so the evaporation mechanism may also be vacuumized in the case of vacuumizing the main chamber 100, until a vacuum level in the crucible accumulation chamber 10 is identical to that in the main chamber 100.

As shown in FIG. 2, the evaporation device further includes a second bracket 300 provided with an accommodation space, arranged under the main chamber 100 and connected to the main chamber 100. The evaporation mechanisms 200 are arranged in the accommodation space of the second bracket 300.

In addition, a second vacuumizer 40 is arranged in the second bracket 300 and connected to the peripheral chamber 20 of each evaporation mechanism 200. In the case that a valve between the second vacuumizer 40 and the peripheral chamber 20 is opened, it is able for the second vacuumizer 40 to vacuumizer the peripheral chamber 20.

During the evaporation process of the evaporation device with the above-mentioned structure, the main chamber 100 may be in communication with the first crucible accumulation chamber to form the enclosed space. In addition, the heating member 30 may be extended into the first crucible accumulation chamber through the opening 14 in the first crucible accumulation chamber. After the main chamber 100 and the first crucible accumulation chamber have been vacuumized by the first vacuumizer, the evaporation process may be performed using the material in the crucible received in the first crucible accumulation chamber. In the case that the material in the crucible received in the first crucible accumulation chamber has been depleted, the through-hole structure in the main chamber 100 may be closed, and the peripheral chamber 20 may be vacuumized to form a vacuum environment. Then, the first bracket 11 provided with the crucible accumulation chambers may be rotated, so as to move the second crucible accumulation chamber to a position corresponding to the through-hole structure in the main chamber 100 and the heating member 30. Next, the main chamber 100 may be vacuumized again, and then the evaporation process may be performed using the material in the crucible received in the second crucible accumulation chamber.

Hence, after the material in the crucible received in the first crucible accumulation chamber has been depleted, it is able to perform a next evaporation process without any necessary to open the vacuum chamber and add a new material, and as a result, it is able to reduce the tact time as well as the pollution.

The present disclosure further provides in some embodiments an evaporation method using the above-mentioned evaporation device, which includes: moving the first crucible accumulation chamber to the evaporation position and enabling the first crucible accumulation chamber to be in communication with the main chamber; heating a material in a crucible received in the first crucible accumulation chamber to perform an evaporation process; in the case that the material in the crucible received in the first crucible accumulation chamber has been depleted, moving the first crucible accumulation chamber away from the evaporation position, moving the second crucible accumulation chamber to the evaporation position, and enabling the second crucible accumulation chamber to be in communication with the main chamber in a vacuum environment; and heating the material in the second crucible accumulation chamber to perform the evaporation process.

To be specific, during the step of heating the material in the crucible received in the second crucible accumulation chamber to perform the evaporation process, the evaporation method further includes moving the crucible out of the first crucible accumulation chamber, adding a new material into the crucible, and moving the crucible into the first crucible accumulation chamber.

Through the evaporation method in the embodiments of the present disclosure, the material may be added into the crucible received in the first crucible accumulation chamber while the evaporation process is being performed using the material in the crucible received in the second crucible accumulation chamber. The second crucible accumulation chamber that is being used for the evaporation process is in communication with the main chamber and is completely isolated from the first crucible accumulation chamber, so the evaporation process using the material in the crucible received in the second crucible accumulation chamber may not be adversely affected by the addition of the material into the crucible received in the first crucible accumulation chamber, i.e., the evaporation process and the addition process may be performed simultaneously. As a result, it is able to improve the evaporation efficiency.

In the case of a plurality of crucible accumulation chambers, apart from the above-mentioned mode, the new materials may also be added into all the crucible accumulation chambers at the same time after the materials therein have been depleted. In other words, subsequent to the step of heating the material in the crucible received in the second crucible accumulation chamber to perform the evaporation process, the evaporation method further includes moving the crucibles out of the first crucible accumulation chamber and the second crucible accumulation chamber respectively, adding new materials into the crucibles, and moving the crucibles into the first crucible accumulation chamber and the second crucible accumulation chamber respectively.

In addition, the step of heating the material in the crucible received in the first crucible accumulation chamber to perform the evaporation process includes: vacuumizing the main chamber so as to enable the main chamber and the first crucible accumulation chamber to be at a predetermined vacuum level; and pre-heating the crucible in the first crucible accumulation chamber to a predetermined temperature, and performing the evaporation process until the material in the crucible has been depleted.

Referring to FIGS. 1-5, the evaporation method using the evaporation device in the embodiments of the present disclosure may include the following steps.

(1) At first, the material for the evaporation may be added into the crucible received in each crucible accumulation chamber 10 on the first bracket 11.

(2) Next, the crucible accumulation chamber 10 may be lifted by the driving mechanism connected to the first bracket 11, so that the surface of the crucible accumulation chamber 10 provided with the opening 14 is closely attached to the side wall of the main chamber 100 (e.g., a state of the evaporation mechanism on the left in FIG. 2), so that the through-hole structure in the main chamber 100 faces toward the opening 14 in the first crucible accumulation chamber. At this time, the heating member 30 may be extended into the first crucible accumulation chamber through the opening 14.

(3) Next, the through-hole structure in the main chamber 100 may be in an open state, so that the main chamber 100 is in communication with the first crucible accumulation chamber. The main chamber 100 may be vacuumized by the first vacuumizer, until the main chamber 100 is at a desired vacuum level identical to the first crucible accumulation chamber.

(4) Next, the crucible in the first crucible accumulation chamber may be heated by the heating member 30, and then the material in the crucible may be evaporated. After the material in the crucible has been depleted, the through-hole structure in the main chamber 100 that is in communication with the crucible accumulation chamber may be closed.

(5) The peripheral chamber 20 may be vacuumized by the second vacuumizer 40, until the peripheral chamber 20 is at a vacuum level identical to the main chamber 100.

(6) The crucible accumulation chamber 10 may be moved downward by the driving mechanism connected to the first bracket 11, so that the crucible accumulation chamber is separated from the heating member (e.g., a state of the evaporation mechanism on the right in FIG. 2). Then, the second crucible accumulation chamber 10 may be driven by the driving mechanism to rotate around the axis, so as to be at a position corresponding to the through-hole structure in the main chamber 100 and the heating member 30.

(7) Next, the second crucible accumulation chamber 10 may be driven by the driving mechanism to move upward, so that the surface of the second crucible accumulation chamber provided with the opening 14 is closely attached onto the side wall of the main chamber 100. At this time, the through-hole structure in the main chamber 100 faces toward the opening 14 in the second crucible accumulation chamber, so the heating member 30 may be extended into the second crucible accumulation chamber through the opening 14.

(8) The through-hole structure in the main chamber 100 may be in an open state, so that the main chamber 100 is in communication with the second crucible. Then, the main chamber 100 may be vacuumized by the second vacuumizer, until the main chamber 100 is at a desired vacuum level identical to the second crucible accumulation chamber. And then, the material in the crucible received in the second crucible accumulation chamber may be heated for the evaporation process.

During the above-mentioned step (8), a new material may be added into the crucible received in the first crucible accumulation chamber. To be specific, the gate 212 on the peripheral chamber 20 and the gate 132 on the first crucible accumulation chamber may be opened, and the crucible may be moved out of the first crucible accumulation chamber and the peripheral chamber. After the new material has been added thereinto, the crucible may be moved into the first crucible accumulation chamber.

In addition, subsequence to the above-mentioned step (8), the evaporation process may be performed using the material in the crucible received in the other cavity, until the materials in all the crucibles have been depleted. Then, the gate 212 on the peripheral chamber 20 may be opened, so as to add the new materials into all the crucibles.

Through the evaporation device and the evaporation method in the embodiments of the present disclosure, after the material in the crucible received in one crucible accumulation chamber has been depleted, it is able to perform a next evaporation process without any necessary to open the vacuum chamber and add a new material, and as a result, it is able to reduce the tact time as well as the pollution.

The above are merely the optional embodiments of the present disclosure. Obviously, a person skilled in the art may make further modifications and improvements without departing from the spirit of the present disclosure, and these modifications and improvements shall also fall within the scope of the present disclosure.

What is claimed is:

1. An evaporation device, comprising:
a main chamber with an internal space and an evaporation mechanism under the main chamber;
wherein the evaporation mechanism comprises at least two crucible accumulation chambers, and the at least two crucible accumulation chambers comprise a first crucible accumulation chamber and a second crucible accumulation chamber; and
wherein the evaporation mechanism is configured to be operated in a first state and in a second state; in the first state, the first crucible accumulation chamber is at an evaporation position and in communication with the main chamber to form a vacuum space, and evaporation of a material in the crucible received in the first crucible accumulation chamber is performed, and the second crucible accumulation chamber is not in communication with the main chamber; and in a second state, in a vacuum environment, the first crucible accumulation chamber is moved away from the evaporation position and is not in communication with the main chamber, and the second crucible accumulation chamber is moved to the evaporation position and in communication with the main chamber.

2. The evaporation device according to claim 1, wherein the evaporation mechanism further comprises a peripheral chamber; the crucible accumulation chambers are in the peripheral chamber; when the evaporation mechanism is in the second state, a vacuum space is defined in the peripheral chamber.

3. The evaporation device according to claim 1, wherein the evaporation mechanism further comprises a first bracket with an accommodation space; the crucible accumulation chambers are in the accommodation space of the first bracket; and a shape of the combined crucible accumulation chambers corresponds to a shape of the accommodation space.

4. The evaporation device according to claim 3, wherein the evaporation mechanism further comprises a driving mechanism connected to the first bracket, and configured to move the first bracket upward and downward and rotate the first bracket, thereby moving the first crucible accumulation chamber away from the evaporation position and moving the second crucible accumulation chamber to the evaporation position in the second state.

5. The evaporation device according to claim 1, wherein an outer wall of each crucible accumulation chamber is covered with a sealant.

6. The evaporation device according to claim 2, wherein the evaporation mechanism further comprises a heating member; the heating member is secured on a side wall of the main chamber; a closable through-hole structure is defined in the side wall of the main chamber and at one side of the heating member; and each crucible accumulation chamber comprises an opening at a surface facing the main chamber; and in the case that each crucible accumulation chamber is at the evaporation position, the surface of the each crucible accumulation chamber is closely attached onto the side wall of the main chamber in such a manner that the opening faces toward the through-hole structure and the each crucible accumulation chamber is in communication with the main chamber through the through-hole structure in an open state, and the heating member is extended into the each crucible accumulation chamber through the opening.

7. The evaporation device according to claim 2, wherein the peripheral chamber is attached onto the side wall of the main chamber, and a portion of the side wall of the main chamber forms a side wall of the peripheral chamber.

8. The evaporation device according to claim 1, wherein each crucible accumulation chamber comprises a first closable opening structure at a lateral wall of the each crucible accumulation chamber; in the case that the first closable opening structure is in an open state, one crucible is capable of moving into or out of the each crucible accumulation chamber.

9. The evaporation device according to claim 2, wherein the peripheral chamber comprises a second closable opening structure at a lateral wall of the peripheral chamber; and the second closable opening structure is configured to be operated in a closed state where an enclosed space is defined inside the peripheral chamber, and in an open state where the crucible accumulation chambers are exposed.

10. The evaporation device according to claim 2, further comprising:
a first vacuumizer configured to form a vacuum environment in the main chamber and one crucible accumulation chamber in communication with the main chamber; and
a second vacuumizer configured to form a vacuum environment in the peripheral chamber.

11. The evaporation device according to claim 1, comprising a plurality of evaporation mechanisms under the main chamber and distributed evenly around a vertical axis of the main chamber.

12. The evaporation device according to claim 11, further comprising a second bracket with an accommodation space; wherein the second bracket is under the main chamber and connected to the main chamber; and the evaporation mechanisms are in the accommodation space of the second bracket.

13. The evaporation device according to claim 1, wherein a closable through-hole structure is defined in a side wall of the main chamber; the evaporation mechanism is located at an outside of the main chamber and controlled to be communicated with the main chamber by opening or closing the closable through-hole structure.

14. The evaporation device according to claim 13, wherein the evaporation mechanism further comprises a heating member on the side wall of the main chamber; the heating member is located at the outside of the main chamber.

15. The evaporation device according to claim 14, wherein the heating member is slidable sleeved around one of the first crucible accumulation chamber and the second crucible accumulation chamber, the one of the first crucible accumulation chamber and the second crucible accumulation chamber being at the evaporation position.

16. The evaporation device according to claim 1, wherein each of the first crucible accumulation chamber and the second crucible accumulation chamber is arranged in a separate vacuumizable chamber.

17. An evaporation method using the evaporation device according to claim 1, comprising:
moving the first crucible accumulation chamber to the evaporation position and enabling the first crucible accumulation chamber to be in communication with the main chamber;
heating a material in a crucible in the first crucible accumulation chamber to perform an evaporation process;
when the material in the crucible in the first crucible accumulation chamber has been depleted, in a vacuum environment, moving the first crucible accumulation chamber away from the evaporation position, and moving the second crucible accumulation chamber to the evaporation position and enabling the second crucible accumulation chamber to be in communication with the main chamber; and
heating a material in a crucible in the second crucible accumulation chamber to perform the evaporation process.

18. The evaporation method according to claim 17, wherein during the heating the material in the crucible in the second crucible accumulation chamber to perform the evaporation process, the evaporation method further comprises:
moving the crucible in the first crucible accumulation chamber outside, adding a new material into the crucible which is moved outside, and moving the crucible which is moved outside into the first crucible accumulation chamber.

19. The evaporation method according to claim 17, wherein subsequent to heating the material in the crucible in the second crucible accumulation chamber to perform the evaporation process, the evaporation method further comprises:
moving the crucibles in the first crucible accumulation chamber and the second crucible accumulation chamber out, respectively, adding new materials into the crucibles which are moved out, and moving the crucibles which are moved out into the first crucible accumulation chamber and the second crucible accumulation chamber, respectively.

20. The evaporation method according to claim 17, wherein the heating the material in the crucible in the first crucible accumulation chamber to perform the evaporation process comprises:
vacuumizing the main chamber in a manner to enable the main chamber and the first crucible accumulation chamber to be at a predetermined vacuum level; and
pre-heating the crucible in the first crucible accumulation chamber to a predetermined temperature, and then performing the evaporation process until the material in the crucible has been depleted.

* * * * *